(12) United States Patent
Agrawal et al.

(10) Patent No.: US 12,730,151 B1
(45) Date of Patent: Sep. 8, 2026

(54) SELF-CORRECTING PATTERN DETECTION ARCHITECTURE

(71) Applicant: Cadence Design Systems, Inc., San Jose, CA (US)

(72) Inventors: Ashish Agrawal, Bangalore (IN); Vikas Kumar Agrawal, Bangalore (IN)

(73) Assignee: Cadence Design Systems, Inc., San Jose, CA (US)

( * ) Notice: Subject to any disclaimer, the term of this patent is extended or adjusted under 35 U.S.C. 154(b) by 65 days.

(21) Appl. No.: 18/788,416

(22) Filed: Jul. 30, 2024

(51) Int. Cl.
*G01R 31/3187* (2006.01)

(52) U.S. Cl.
CPC ................................ *G01R 31/3187* (2013.01)

(58) Field of Classification Search
None
See application file for complete search history.

(56) References Cited

U.S. PATENT DOCUMENTS

2022/0222198 A1* 7/2022 Lanka ................ G06F 13/4273
2022/0237138 A1* 7/2022 Lanka ................ G06F 13/4027
2022/0327083 A1* 10/2022 Das Sharma ....... G06F 13/4221
2024/0095206 A1* 3/2024 Dakshinamurthy ........................ G06F 13/4282
2024/0402751 A1* 12/2024 Godavarthi ............... G06F 1/08
2025/0077355 A1* 3/2025 Akavaram .......... G06F 13/4282

OTHER PUBLICATIONS

M. J. Sarmah and S. Azeemuddin, "A Circuit to Eliminate Serial Skew in High-Speed Serial Communication Channels," in IEEE Transactions on Circuits and Systems II: Express Briefs, vol. 62, No. 12, pp. 1179-1183, Dec. 2015, (Year: 2015).*
D. Das Sharma, G. Pasdast, Z. Qian and K. Aygun, "Universal Chiplet Interconnect Express (UCIe): An Open Industry Standard for Innovations With Chiplets at Package Level," in IEEE Transactions on Components, Packaging and Manufacturing Technology, vol. 12, No. 9, pp. 1423-1431, Sep. 2022, (Year: 2022).*

* cited by examiner

*Primary Examiner* — Daniel F. McMahon
(74) *Attorney, Agent, or Firm* — Mark H. Whittenberger; Holland & Knight LLP

(57) ABSTRACT

Embodiments included herein are directed towards sideband initialization (SBINIT) pattern detection. Embodiments include providing a self-correcting SBINIT pattern detection circuit configured to receive a first SBINIT pattern and a second SBINIT pattern. Embodiments further include providing resetting pattern detection circuit operatively connected with the self-correcting SBINIT pattern detection logic, wherein a reset pulse is configured to shift match/mismatch information of a current pattern to a previous pattern.

17 Claims, 9 Drawing Sheets

300

400

600

800 providing a self-correcting SBINIT pattern detection circuit configured to receive a first SBINIT pattern and a second SBINIT pattern

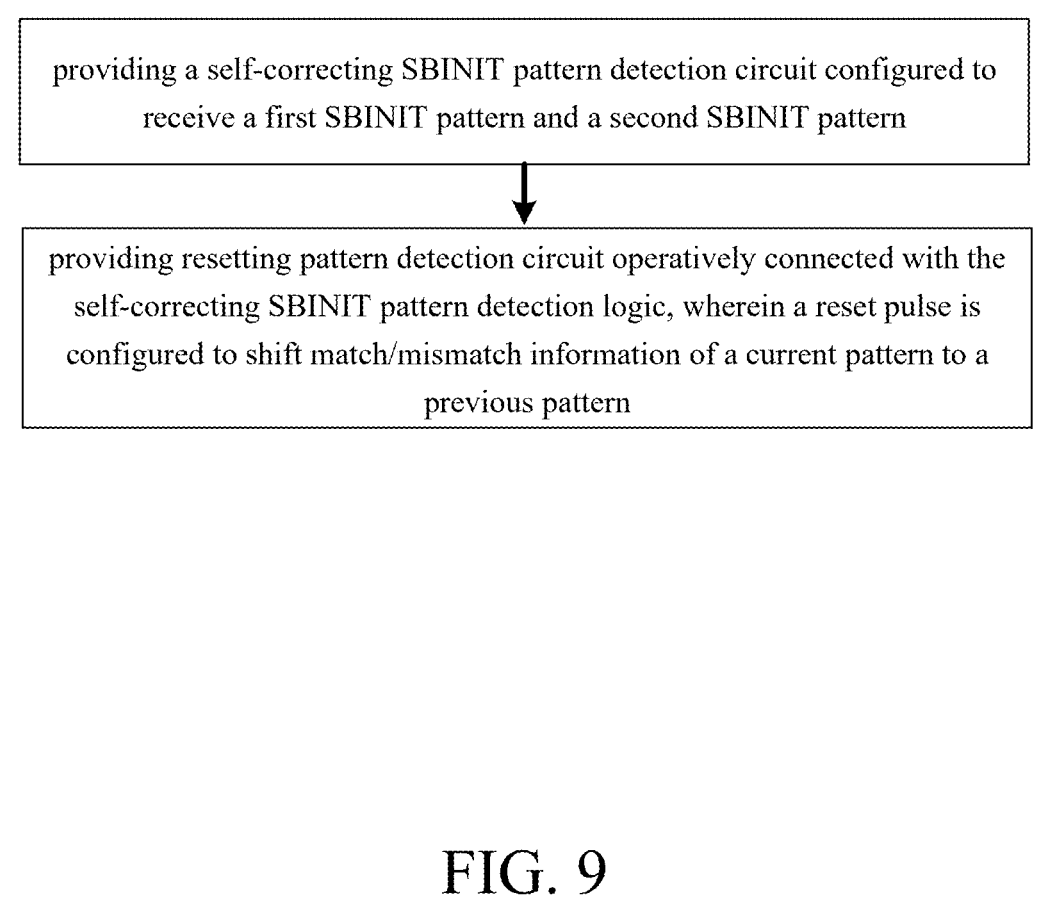

↓ providing resetting pattern detection circuit operatively connected with the self-correcting SBINIT pattern detection logic, wherein a reset pulse is configured to shift match/mismatch information of a current pattern to a previous pattern

FIG. 9

SELF-CORRECTING PATTERN DETECTION ARCHITECTURE

BACKGROUND

Universal Chiplet Interconnect express (UCIe) is an open, multi-protocol capable, on-package interconnect standard for connecting multiple dies on the same package. UCIe is a layered protocol, with each layer performing a distinct set of functions. It may include a protocol layer, D2D adaptor, and physical layer. The physical layer of UCIe may include a Sideband (SB) and Main-Band (MB). The SB may be used for parameter exchanges, register accesses for debug/compliance and co-ordination with remote partner for link training and management. The MB is a data interface where actual data flow occurs. It may include a forwarded clock, a data valid pin, and N Lanes of data per module.

SUMMARY

In one or more embodiments of the present disclosure, a method for sideband initialization (SBINIT) pattern detection is provided. The method may include providing a self-correcting SBINIT pattern detection circuit configured to receive a first SBINIT pattern and a second SBINIT pattern. The method may further include providing resetting pattern detection circuit operatively connected with the self-correcting SBINIT pattern detection logic, wherein a reset pulse is configured to shift match/mismatch information of a current pattern to a previous pattern.

One or more of the following features may be included. In some embodiments, at least one of the first SBINIT pattern and the second SBINIT pattern is configurable. The self-correcting SBINIT pattern detection circuit may be configured to rectify a time difference associated with at least one die coming out of a RESET state. The self-correcting SBINIT pattern detection circuit may include a 64-bit programmable register. The self-correcting SBINIT pattern detection circuit and resetting pattern detection circuit may be included within a UCIe architecture. The first SBINIT pattern and the second SBINIT pattern may include two consecutive clocking patterns. The resetting pattern detection circuit may include a 6-bit reset counter. The RESET pulse may be further configured to reset the current pattern. The resetting pattern detection circuit may be configured to operate if an incorrect pattern having a lesser or greater number of clock edges is received. The self-correcting SBINIT pattern detection circuit may include an XOR gate configured to receive an input from the 64-bit programmable register.

In one or more embodiments of the present disclosure a system for sideband initialization (SBINIT) pattern detection is provided. The system may include a self-correcting SBINIT pattern detection circuit configured to receive a first SBINIT pattern and a second SBINIT pattern. The system may further include a resetting pattern detection circuit operatively connected with the self-correcting SBINIT pattern detection logic, wherein a reset pulse is configured to shift match/mismatch information of a current pattern to a previous pattern.

One or more of the following features may be included. In some embodiments, at least one of the first SBINIT pattern and the second SBINIT pattern is configurable. The self-correcting SBINIT pattern detection circuit may be configured to rectify a time difference associated with at least one die coming out of a RESET state. The self-correcting SBINIT pattern detection circuit may include a 64-bit programmable register. The self-correcting SBINIT pattern detection circuit and resetting pattern detection circuit may be included within a UCIe architecture. The first SBINIT pattern and the second SBINIT pattern may include two consecutive clocking patterns. The resetting pattern detection circuit may include a 6-bit reset counter. The RESET pulse may be further configured to reset the current pattern. The resetting pattern detection circuit may be configured to operate if an incorrect pattern having a lesser or greater number of clock edges is received. The self-correcting SBINIT pattern detection circuit may include an XOR gate configured to receive an input from the 64-bit programmable register.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIG. 9 shows a flowchart depicting operations consistent with embodiments of the present disclosure.

DETAILED DESCRIPTION

Embodiments of the present disclosure are directed toward an SBINIT pattern detection architecture that may be used in a UCIe PHY to make it flexible, robust and self-correcting. This particular architecture may be used to set a helpful initial starting point for training.

Figure 1:
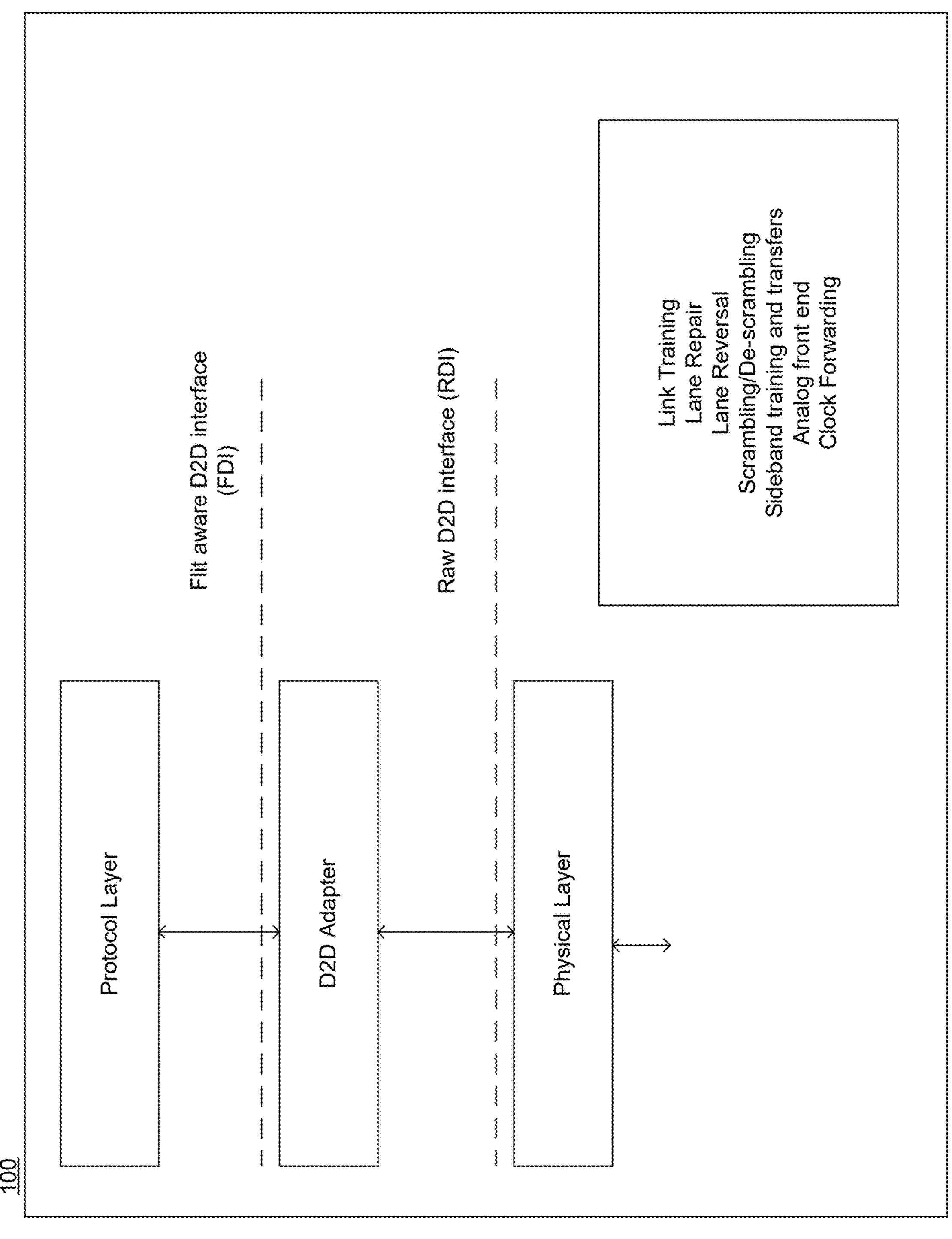
FIG. 1 shows an example block diagram of UCIe layers consistent with embodiments of the present disclosure.

Referring now to FIG. 1, an example block diagram 100 showing UCIe layers consistent with embodiments of the present disclosure is provided. UCIe is a layered protocol, with each layer performing a distinct set of functions. It may include a protocol layer, die-to-die (D2D) adaptor, and physical layer. Here, a "protocol layer" may refer to a distinct and hierarchically organized component of a computer network, responsible for governing specific functions, rules, and interactions within the network. A die-to-die adapter may be a functional block that provides the data interface between two silicon dies assembled in the same package. The physical layer may be the closest layer to the physical connection between devices and may define the relationship between a device and a transmission medium, such as a cable.

Figure 2:
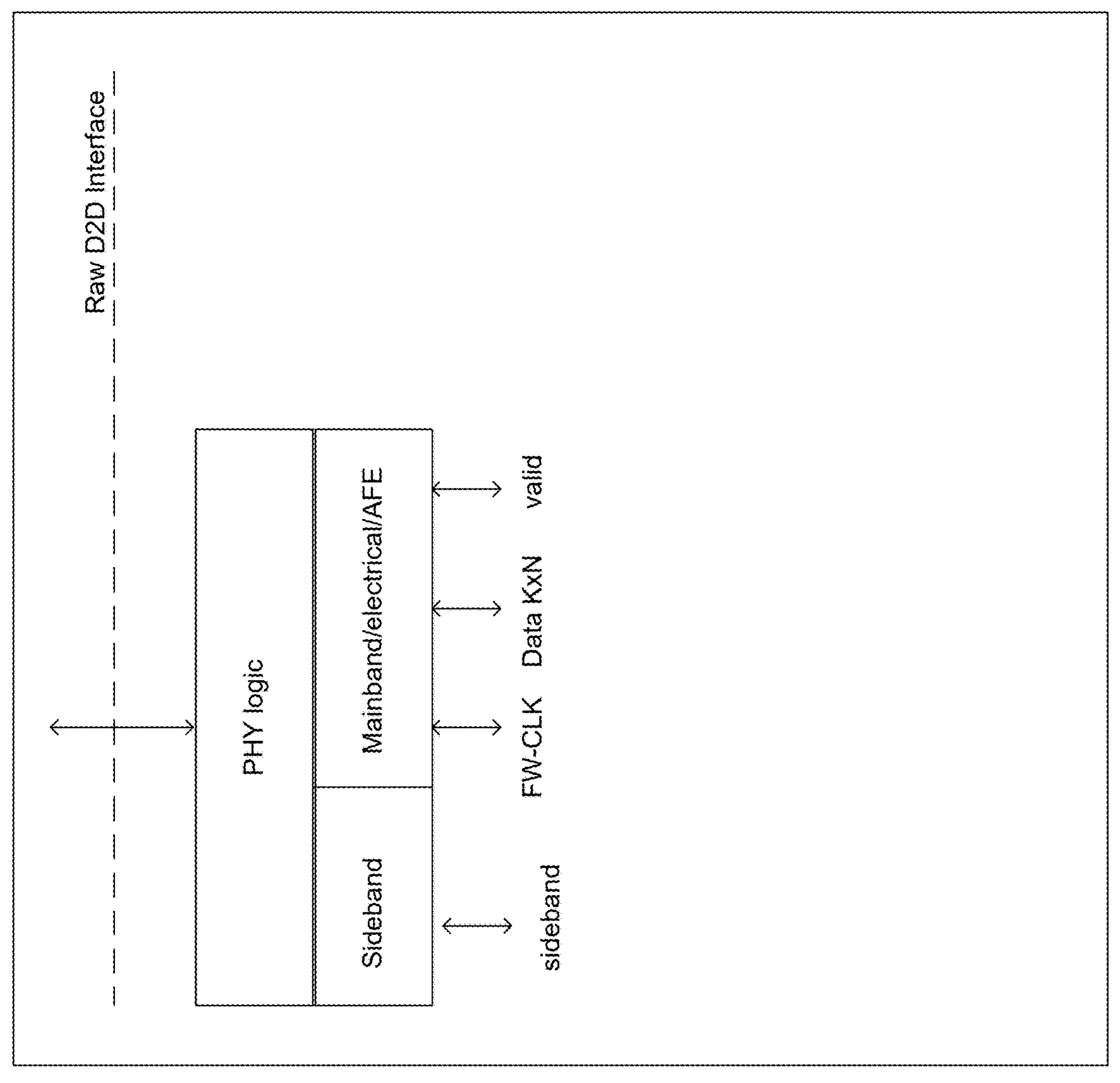
FIG. 2 shows an example block diagram of physical layer components consistent with embodiments of the present disclosure.

Referring now to FIG. 2, an example block diagram 200 of physical layer components consistent with embodiments of the present disclosure is provided. The physical layer of UCIe may include sideband 202 and main-band 204. Sideband 202 may be used for parameter exchanges, register accesses for debug/compliance and co-ordination with remote partner for link training and management. Main-band 204 may be a data interface where actual data flow occurs, and may include a forwarded clock, a data valid pin, and N Lanes of data per module.

Figure 3:
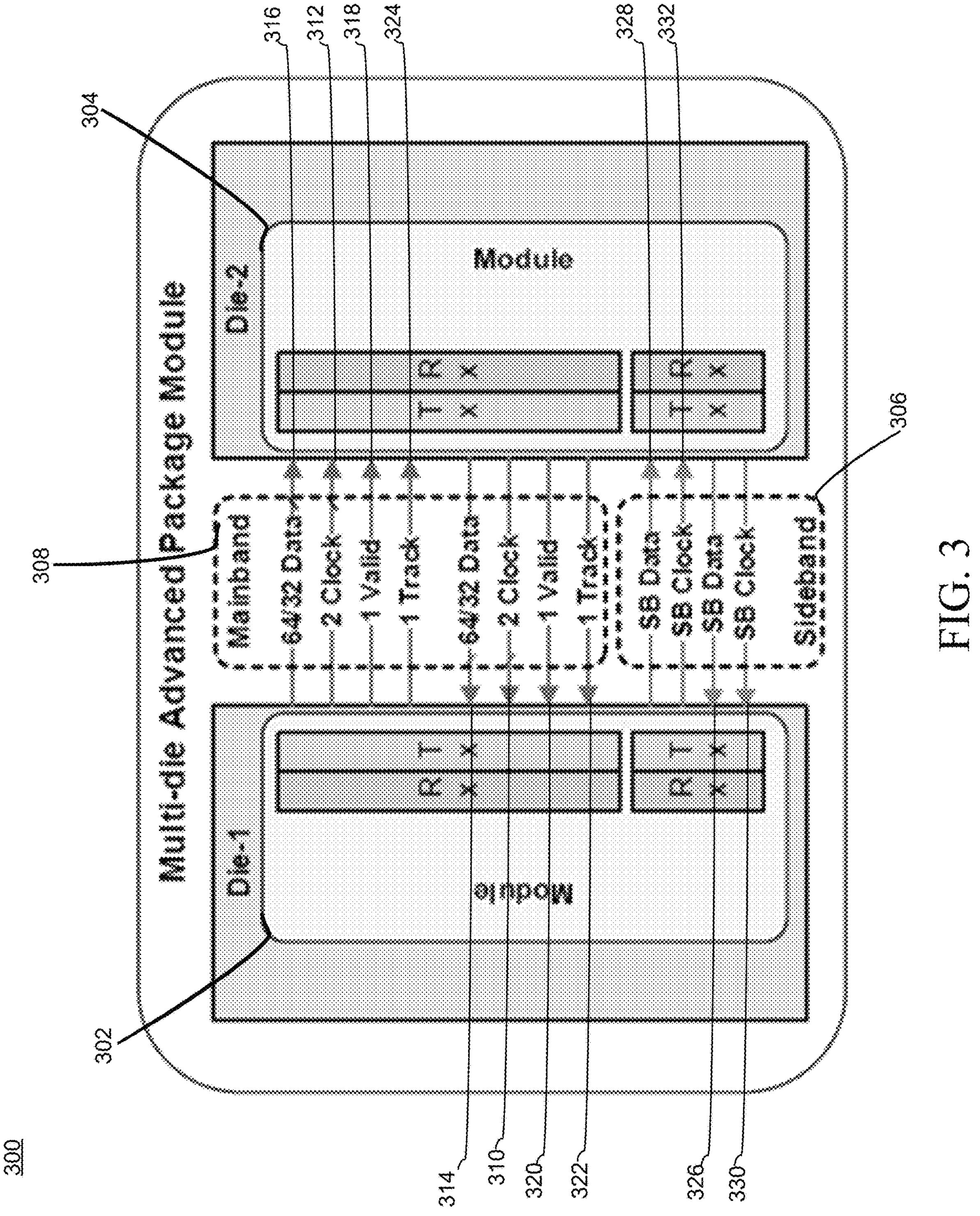
FIG. 3 shows an example of a UCIe physical interface consistent with embodiments of the present disclosure.

Referring now to FIG. 3, an example diagram 300 of a UCIe physical interface consistent with embodiments of the present disclosure is provided. The UCIe physical interface may include one or more building blocks referred to herein as modules. More specifically, example 300 may include a first module 302 and a second module 304. Additionally, example 300 may further include a low-speed sideband bus 306 and a main-band bus 308. First module 302 and second module 304 may use advanced packaging technology (e.g., embedded multi-die interconnect bridge (EMIB), chip-on-wafer-on-substrate (CoWoS), etc.) called an "advanced package module" and may further include a pair of clocks 310, 312, sixty-four or thirty-two single-ended data lanes 314, 316 for x64 or x32 advanced package module, respectively, data valid lanes 318, 320 going in each direction (transmit and receive) and track lanes 322, 324 in each direction. Sideband 306 may be configured to facilitate initialization, link training, and configuration of reads/writes, and may further include single-ended sideband data lanes 326, 328 and single-ended sideband clock lanes 330, 332 in both directions (transmit and receive).

Figure 4:
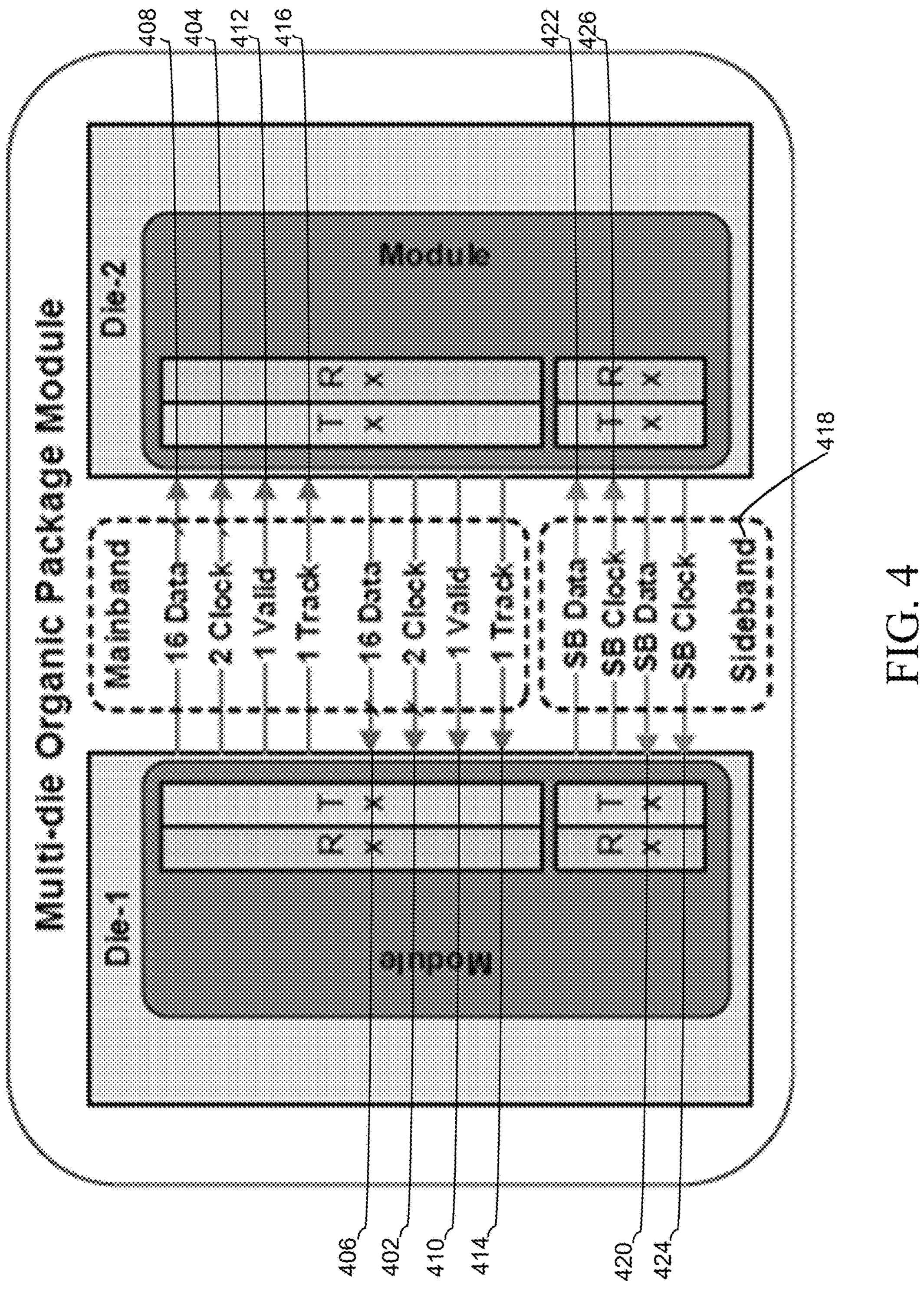
FIG. 4 shows an example of a Standard Package Module consistent with embodiments of the present disclosure.

Referring now to FIG. 4, an example diagram 400 of a standard package module consistent with embodiments of the present disclosure is provided. The "standard package module" uses a traditional standard packaging with a larger pitch. A standard package module may include a pair of clocks 402, 404, sixteen single-ended data lanes 406, 408, data valid lanes 410, 412 and track lanes 414, 416 in each direction (transmit and receive). Example diagram 400 may include low-speed sideband bus 418 configured to facilitate initialization, link training, and configuration reads/writes. Sideband 418 may further include single-ended sideband data lanes 420, 422 and single-ended sideband clock lanes 424, 426 in both directions (transmit and receive).

In some embodiments, UCIe, SBINIT pattern detection may be the first step before initiating any link training or sideband transaction. In operation, both dies (modules) send the iterations of a 64 UI clock pattern (e.g., a clock pattern may be defined as starting with 1b and toggling every UI of transmission, i.e., 1010 . . . ) and 32 UI low on its sideband data transmitter (TXDATASB). The UCIe may send a strobe on its sideband clock (TXCKSB) during the 64-UI clock pattern transmission and be gated (held low) otherwise. The UCIe module partner (remote dies) may sample the incoming data pattern with the incoming clock. Sideband pattern detection may be considered successful if 128 UI clock pattern is detected. If two dies have different delays for releasing the resets internally or if anything is wrong with the pattern sent by one die, then the remote die may never be able to detect the correct patterns due to misalignment, and training may not be able to proceed further.

Embodiments of the present disclosure may overcome this problem by providing a robust self-correcting solution for detecting the SBINIT pattern. If anything is wrong with the first pattern, this logic self-corrects and gets ready for detecting the next pattern rather than keeping the misaligned information.

Figure 5:
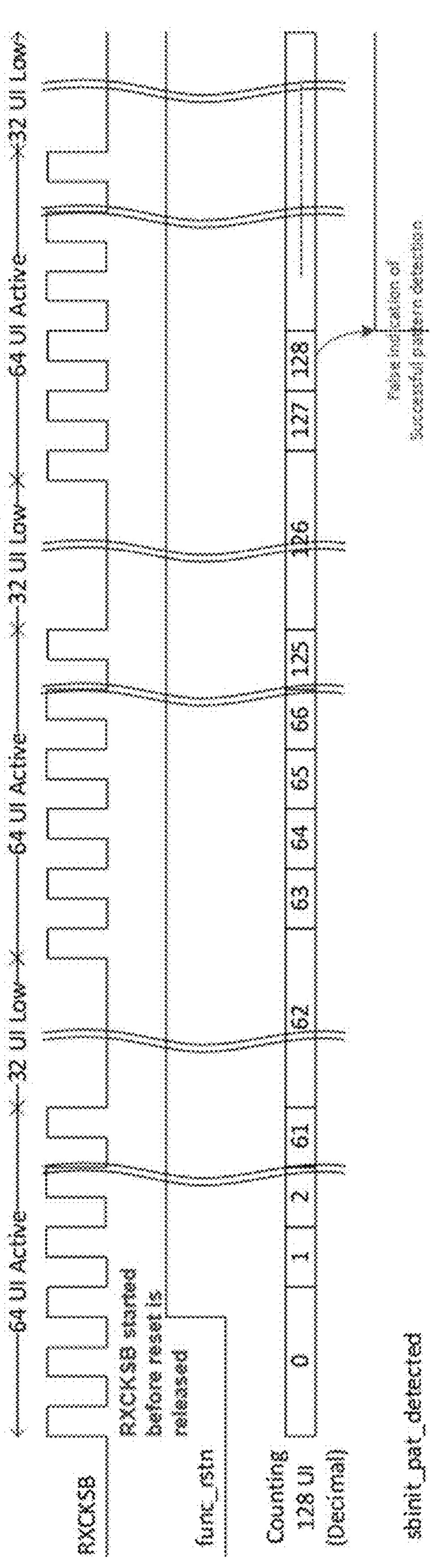
FIG. 5 shows an SBINIT timing diagram consistent with embodiments of the present disclosure.
Figure 5:
Figure 6:
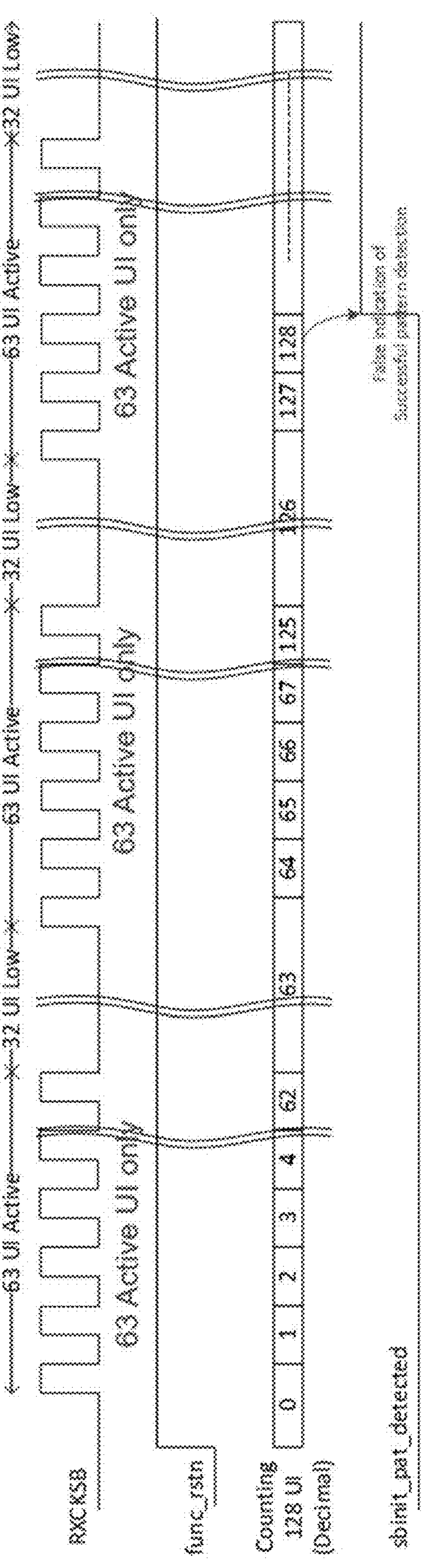
FIG. 6 shows another SBINIT timing diagram consistent with embodiments of the present disclosure.

Referring now to FIGS. 5-6, SBINIT timing diagrams 500 and 600 consistent with embodiments of the present disclosure are provided. In existing approaches, UCIe modules start sending the SBINIT patterns when they move from their RESET state to the SBINIT state. Sideband pattern detection may be considered successful if 128 UI clock pattern is detected. There may be time differences in both dies coming out of RESET. It may happen that when one die starts sending the active 64 UI clock pattern, the receiving die comes out of RESET in between this duration and enables its detection logic. In this case, some of the UIs may have already been missed in detection logic and simply counting the 128 UI clock pattern will be false detection. This is shown in timing diagram 500 of FIG. 5. Another problem with the conventional approach may be, if there is an issue with the patterns sent by the remote die, instead of sending 64 UI clock patterns if it sends less or more number of UIs clock patterns then just counting 128 UI clock pattern may result into false detection. This is shown in timing diagram 600 of FIG. 6.

Figure 7:
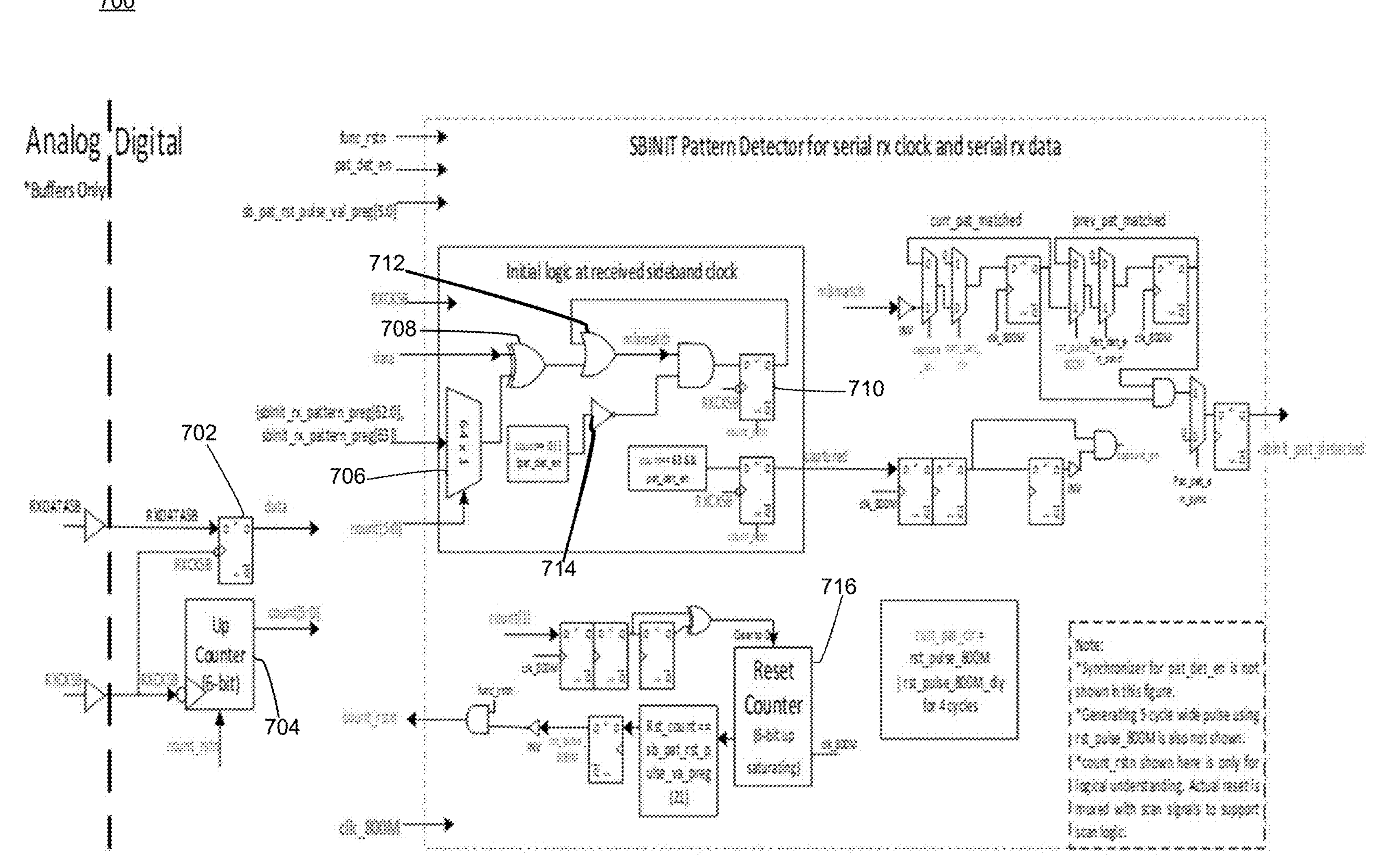
FIG. 7 shows an SBINIT pattern detection circuit consistent with embodiments of the present disclosure.
Figure 8:
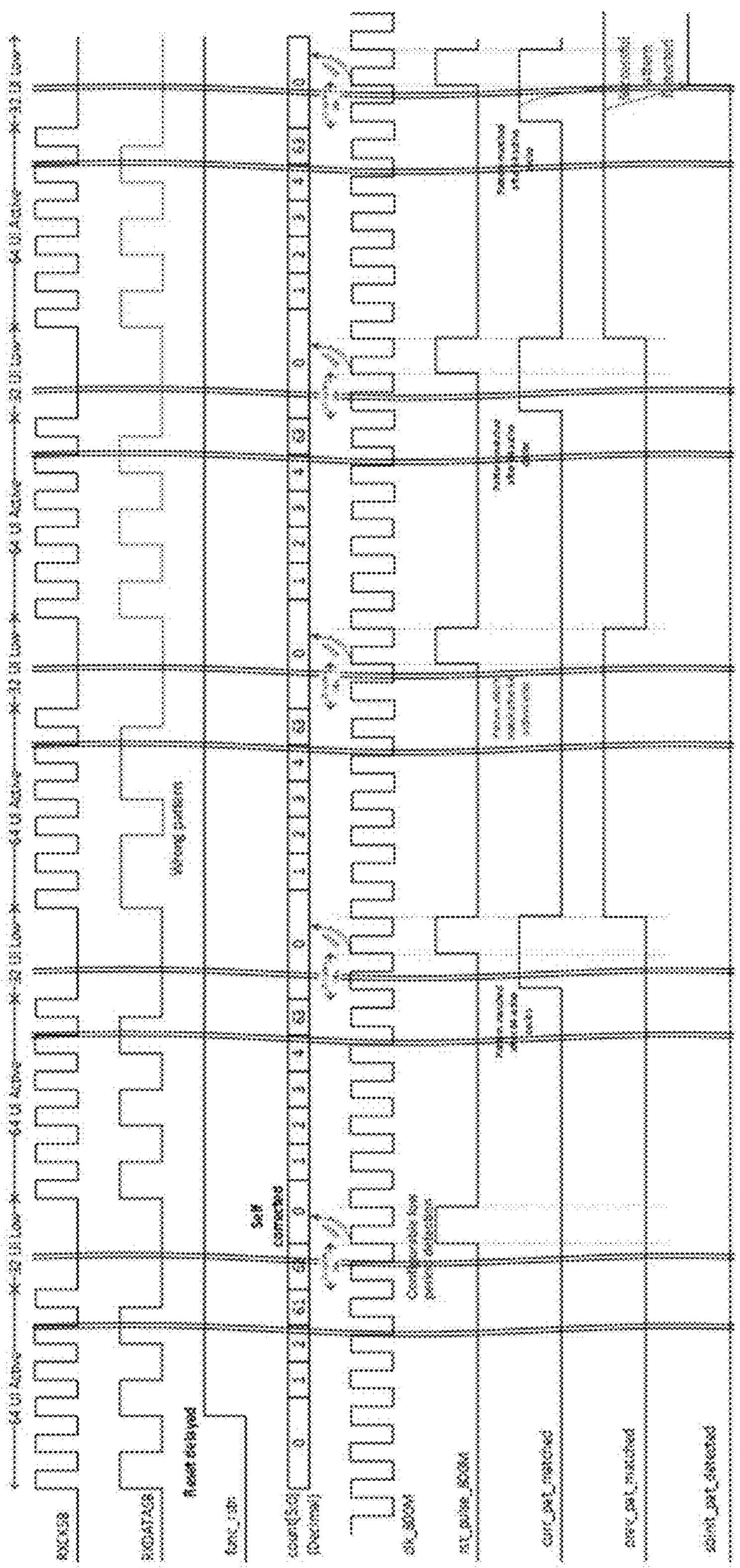
FIG. 8 shows another SBINIT timing diagram consistent with embodiments of the present disclosure.

Referring now to FIGS. 7-9, an SBINIT pattern detection circuit 700, SBINIT timing diagram 800, and a flowchart 900 depicting operations consistent with embodiments of the present disclosure are provided. Unlike conventional approaches, embodiments included herein may detect the two consecutive SBINIT patterns instead of counting 128 UIs together and may perform self-resetting of the counter during the low period for a fresh start in order to overcome any lesser or greater number of clock edges in previous pattern or time differences between two dies coming out of RESET. The same reset pulse may be used to shift the match/mismatch information of current pattern into previous pattern and clear it for the next pattern detection which ensures good low period must be present to qualify the correct pattern detection. Embodiments included herein may also work even if 32 UI of low period is shortened or lengthened by having flexibility to configure the number of cycles to count for reset pulse generation. Embodiments included herein may also provide the flexibility to configure the pattern to be detected instead of keeping it to a fixed value. The most common confusion may occur for a clocking pattern where one die may start sending pattern with 010101, however, the receiving die may be expecting 101010. Using the configurable pattern, the receiving die may be configured to the expected pattern value. The SBINIT pattern detection logic diagram and waveform are discussed in further detail hereinbelow.

Referring again to FIG. 7, a diagram showing exemplary SBINIT pattern detection circuitry 700 is provided. The proposed logic may capture the RXDATASB using the negative edge of RXCKSB into flop 702, which generates a data signal. Along with this, it may also count the 64 negative edges (0 to 63) of the incoming RXCKSB clock using a 6-bit up counter 704 count[5:0] which may be reset using the self-correcting logic. The data and count[5:0] signals may be used by the rest of the logic to detect the SBINIT pattern.

In some embodiments, the logic may use a 64x1 multiplexer 706 to select one bit at a time of the sbinit_rx_pattern_preg[63:0] register, based on the count value; and compares it with a data signal at XOR gate 708. By default, SBINIT pattern may be a clocking pattern, but programmable register sbinit_rx_pattern_preg[63:0] may be used to provide flexibility.

In some embodiments, since flopped data may be compared with the pattern, hence multiplexer 706 selects the corresponding sbinit_rx_pattern_preg bit value to match the one cycle data. For example, when the count value is 2, the sbinit_rx_pattern_preg[1] may be selected. When the count value is 63, sbinit_rx_pattern_preg[62] may be selected. For the last 63rd bit, count value 0 may be used.

In some embodiments, with every bit comparison, the result may be stored into flop 710, which may be compared at an OR gate 712 with the next result on every bit comparison. This stored mismatch flop 710 may be cleared at the start of the next packet, using count value 0. This also ensures that the first clock edge comparison may not be captured when the count value is 0 because logic compares with one cycle delayed data, and at count value 0, this delayed data may be from the previous packet's last bit.

In some embodiments, since the number of clock edges may be fixed to 64 for serial clock and one cycle delayed data may be used for pattern comparison, the last bit compare result may not be stored using serial sideband clock. Hence, the output of combinatorial OR gate 712 mismatch may be captured into clk_800M domain as curr_pat_matched. The last value of the count may be transferred as a captured signal from the serial sideband clock domain to the clk_800M domain. The synchronized captured signal rising edge may be used as a qualifier to capture the mismatch output of combinatorial OR gate 712 (followed by inverter 714) from the serial receiver clock domain to clk_800M domain as curr_pat_matched. A separate free running clk_800M (of frequency 800 MHz corresponding to RXCKSB) may be used for this logic because RXCKSB is not free running. This clk_800M may be the same clock which may be used in the transmit path for transmitting TXCKSB.

In some embodiments, the logic may use 6-bit reset counter 716 (up counter saturating) working on free running clk_800M. Reset counter 716 may be used to look for a low period of the pattern and generate the reset pulse to the main count (working on serial received clock), whenever it detects count value is not toggling for 22 (decimal value, programmable 6-bit register sb_pat_rst_pulse_val_preg) clk_800M cycles. In some cases, all 64 edges of the serial clock may not be received, and the low period would have started, resetting helps to start the count value from fresh 0, whenever the next active period starts.

In some embodiments, the default value 22 may be chosen to reset the count, accounting for a 20% frequency variation. The logic considers around 20% maximum frequency variation of local 800 MHz with respect to incoming serial receiver clock. This may translate the 32 UI low period within the range of 33.33 ns (@800 MHz+20%) to 50 ns (@800 MHZ-20%). The 22 cycles at 800 MHz are 27.5 ns. Hence, only a single reset pulse may be generated during actual 32 UI low period.

In some embodiments, the second least significant bit (LSB) of counter 702 (count[1]) may be synchronized into local clk_800 MHz. If toggling of synchronized count[1] is detected, then reset counter 716 may re-start from 0. If there is no toggling on count[1], reset counter 716 may continue counting until saturation. Once reset counter 716 reaches programmable register sb_pat_rst_pulse_val_preg value (default 'd21, indicates 22 cycles), a single cycle rst_pulse_800M may be generated. The waveform shown in FIG. 8 depicts how rst_pulse_800M may be generated during the 32 UI of the low period. If 32 UI of low period is shortened or lengthened, embodiments included herein may provide a flexibility to configure the register sb_pat_rst_pulse_val_preg value accordingly, so that it may still detect the pattern.

In some embodiments, the rst_pulse_800M may be combined with func_rstn to generate the asynchronous reset count_rstn to reset the count on serial clock. The same rst_pulse_800M may be used to shift the curr_pat_matched information to prev_pat_matched and reset the curr_pat_matched. If it is a good low period then the detected pattern value may be shifted to prev_pat_matched. However, if it is a bad active period, then it has cleared the curr_pat_matched and next time again a low period is detected (bad active period followed by low period), which generates rst_pulse_800M again, and shifts the cleared value of curr_pat_matched information to prev_pat_matched.

In some embodiments, shifting the curr_pat_matched value to prev_pat_matched and clearing the curr_pat_matched at rst_pulse_800M ensures that, in the case of a good low period, the logic may not lose the good pattern detected information, and in the case of a bad active period, the cleared value may be shifted to indicate fresh start for pattern detection.

In some embodiments, due to asynchronous reset to count and other pattern detector flops working on serial receiver clock, flops output may go metastable if the clock negative edge arrives at the same time of releasing the rst_pulse_800M. Since reset counter 712 keeps tracking the low period status of count, hence the logic can recover from next pattern onwards. However, to avoid capturing any metastable information into clk_800M domain, the curr_pat_matched flop may be kept cleared for 5 clock cycles.

In some embodiments, as soon as both flops curr_pat_matched and prev_pat_matched contain 1's, this may indicate two continuous SBINIT patterns are detected. A sbinit_pat_detected output signal may be generated which may indicate a successful SBINIT pattern detection as shown in FIG. 8.

Embodiments of the present disclosure provide numerous advantages over existing solutions. The architectures provided herein provide a robust self-correcting SBINIT pattern detection logic for cases when there are time differences between two dies coming out of RESET. Embodiments also provide a robust self-correcting/resetting SBINIT pattern detection logic for cases if in between any wrong pattern (lesser or greater number of active clock edges) are received The uniqueness of this solution is not only doing the self-resetting but the same reset pulse rst_pulse_800M is used to shift the curr_pat_matched information to prev_pat_matched and reset the curr_pat_matched. In case of good low period, logic doesn't lose the good pattern detected information, and in case of bad active period, cleared value gets shifted to indicate fresh start for pattern detection. This ensures detection of good low period as well to qualify for correct pattern detection.

Using the configurable value (default decimal 22 for 32 UI) to generate reset pulse during low period of the pattern provides flexibility to detect the patterns successfully even if low period is shortened/lengthened than 32 UI as configurable value can be configured accordingly. Using just 64-bit programmable register, invention provides flexibility to detect any pattern value rather than fixing it to clocking pattern value.

Referring not to FIG. 9, a flowchart 900 showing one or more operations for sideband initialization (SBINIT) pattern detection consistent with embodiments of the present disclosure is provided. The method may include providing (902) a self-correcting SBINIT pattern detection circuit configured to receive a first SBINIT pattern and a second SBINIT pattern. The method may further include providing (904) resetting pattern detection circuit operatively connected with the self-correcting SBINIT pattern detection logic, wherein a reset pulse is configured to shift match/mismatch information of a current pattern to a previous pattern. Numerous other operations are also within the scope of the present disclosure.

It will be apparent to those skilled in the art that various modifications and variations can be made in the embodiments of the present disclosure without departing from the spirit or scope of the invention. Thus, it is intended that embodiments of the present disclosure cover the modifications and variations of this invention provided they come within the scope of the appended claims and their equivalents.

What is claimed is:

1. A method for sideband initialization (SBINIT) pattern detection comprising:

providing a self-correcting SBINIT pattern detection circuit configured to receive a first SBINIT pattern and a second SBINIT pattern, wherein the self-correcting SBINIT pattern detection circuit includes a programmable register;

providing resetting pattern detection circuit operatively connected with the self-correcting SBINIT pattern detection circuit, wherein a reset pulse is configured to shift match/mismatch information of a current pattern to a previous pattern; and receiving an input from the programmable register at an XOR gate.

2. The method for sideband initialization (SBINIT) pattern detection of claim 1, wherein at least one of the first SBINIT pattern and the second SBINIT pattern is configurable.

3. The method for sideband initialization (SBINIT) pattern detection of claim 1, wherein the self-correcting SBINIT pattern detection circuit is configured to rectify a time difference associated with at least one die coming out of a RESET state.

4. The method for sideband initialization (SBINIT) pattern detection of claim 1, wherein the programmable register is a 64-bit programmable register.

5. The method for sideband initialization (SBINIT) pattern detection of claim 1, wherein the self-correcting SBINIT pattern detection circuit and resetting pattern detection circuit are included within a Universal Chiplet Interconnect express (UCIe) architecture.

6. The method for sideband initialization (SBINIT) pattern detection of claim 1, wherein the first SBINIT pattern and the second SBINIT pattern are two clocking patterns.

7. The method for sideband initialization (SBINIT) pattern detection claim 1, wherein the resetting pattern detection circuit includes a 6-bit reset counter.

8. The method for sideband initialization (SBINIT) pattern detection of claim 1, wherein the reset pulse is further configured to reset the current pattern.

9. The method for sideband initialization (SBINIT) pattern detection of claim 1, wherein the resetting pattern detection circuit is enabled if an incorrect pattern having a lesser or greater number of clock edges is received.

10. A system for sideband initialization (SBINIT) pattern detection comprising:

a self-correcting SBINIT pattern detection circuitry configured to receive a first SBINIT pattern and a second SBINIT pattern, wherein the self-correcting SBINIT pattern detection circuit includes a 64-bit programmable register;

a resetting pattern detection circuit operatively connected with the self-correcting SBINIT pattern detection circuit, wherein a reset pulse is configured to shift match/mismatch information of a current pattern to a previous pattern; and an XOR gate configured to receive an input from the 64-bit programmable register.

11. The system for sideband initialization (SBINIT) pattern detection of claim 10, wherein at least one of the first SBINIT pattern and the second SBINIT pattern is configurable.

12. The system for sideband initialization (SBINIT) pattern detection of claim 10, wherein the self-correcting SBINIT pattern detection circuit is configured to rectify a time difference associated with at least one die coming out of a RESET state.

13. The system for sideband initialization (SBINIT) pattern detection of claim 10, wherein the self-correcting SBINIT pattern detection circuit and resetting pattern detection circuit are included within a Universal Chiplet Interconnect express (UCIe) architecture.

14. The system for sideband initialization (SBINIT) pattern detection of claim 10, wherein the first SBINIT pattern and the second SBINIT pattern are two clocking patterns.

15. The system for sideband initialization (SBINIT) pattern detection claim 10, wherein the resetting pattern detection circuit includes a 6-bit reset counter.

16. The system for sideband initialization (SBINIT) pattern detection of claim 1, wherein the reset pulse is further configured to reset the current pattern.

17. The system for sideband initialization (SBINIT) pattern detection of claim 10, wherein the resetting pattern detection circuit is enabled if an incorrect pattern having a lesser or greater number of clock edges is received.

* * * * *